United States Patent [19]
Sugiura et al.

[11] Patent Number: 5,599,159
[45] Date of Patent: Feb. 4, 1997

[54] PELLET CONVEYING DEVICE

[75] Inventors: Kazuo Sugiura; Yoshimitsu Hisajima, both of Tokyo, Japan; Naoki Kanayama, San Jose, Calif.

[73] Assignees: Kabushiki Kaisha Shinkawa, Tokyo, Japan; Shinkawa U.S.A., Inc., Santa Clara, Calif.

[21] Appl. No.: 470,770

[22] Filed: Jun. 6, 1995

[30] Foreign Application Priority Data

Nov. 25, 1994 [JP] Japan .................................. 6-314280

[51] Int. Cl.⁶ .................................................. B66C 23/00
[52] U.S. Cl. ........................ 414/744.3; 901/17; 901/21; 74/490.04; 74/490.08
[58] Field of Search ............................. 414/744.3, 744.8; 901/15, 17, 18, 21; 74/490.04, 490.08, 479.01

[56] References Cited

FOREIGN PATENT DOCUMENTS

| | | | |
|---|---|---|---|
| 57-122535 | 7/1982 | Japan | H01L 21/58 |
| 199780 | 8/1989 | Japan | 414/744.3 |
| 3-40502 | 6/1991 | Japan | H01L 21/52 |

*Primary Examiner*—Donald W. Underwood
*Attorney, Agent, or Firm*—Koda and Androlia

[57] ABSTRACT

A pellet conveying device used with a bonding machine for, for example, semiconductor devices, including a conveying arm that has a collet for holding pellets. The conveying arm can move vertically and pivot horizontally by two different driving sources so that the collet can be moved between predetermined two positions such as a pellet pick-up position and a pellet releasing position.

2 Claims, 1 Drawing Sheet

PELLET CONVEYING DEVICE

BACKGROUND OF THE INVENTION

1. Field of the Invention

The present invention relates to a pellet conveying device which can be used in a die (pellet) bonding apparatus, a pellet jig loading device, etc.

2. Prior Art

In a die bonding apparatus, as well known, dies (pellets) on a pick-up stage are, for example, suction-chucked, picked up and conveyed to a bonding stage by a collet; and then the dies are bonded to a lead frame, substrate, etc. on the die bonding stage. Accordingly, the die bonding apparatus requires a raising and lowering mechanism, which raises and lowers the collet, and a reciprocating motion mechanism, which moves the collet back and forth between the pick-up stage and the bonding stage.

The following apparatuses are known as conventional types of die bonding apparatuses: In the first type, the raising and lowering motions of the collet are accomplished using a cam, and the reciprocating movement of the collet is accomplished by moving an XY table, on which the entire apparatus is mounted, in the X and Y directions. This type of bonding apparatus is disclosed in Japanese Patent Application Laid-Open (Kokai) No. 57-122535 and Japanese Patent Application Publication (Kokoku) No. 3-40502. In the second type of the bonding apparatus, the raising and lowering motion of the collet are accomplished by using a cam to raise and lower the entire apparatus, and the reciprocating movement of the collet is accomplished by pivoting a conveying arm which holds the collet.

In the first type of bonding apparatus, the reciprocating movement of the collet is accomplished by driving the entire apparatus with an XY table; and in the second type of apparatus, the collet is raised and lowered by driving the entire apparatus with a cam. Accordingly, in these apparatuses the weight of the moving components is large, and it is not possible to convey the collet at high-speed. As a result, the conventional apparatuses are in lack of productivity.

SUMMARY OF THE INVENTION

The object of the present invention is to provide pellet conveying device in which the weight of the moving components is less, thus allowing high-speed conveying of the collet, improving the productivity.

The object of the present invention is accomplished by a unique structure that includes: a screw shaft which has a threaded portion, a pivot frame which is rotatably supported on the screw shaft, a conveying arm which is screw-engaged with the threaded portion of the screw shaft and engaged with the pivot frame so that the conveying arm can pivot together with the pivot frame and move up and down with respect to the pivot frame, a collet which is attached to the conveying arm, a screw shaft driving means which rotates the screw shaft, and a pivoting driving means which pivots the pivot frame.

With the above described structure, when the screw shaft rotates, the collet is raised and lowered together with the conveying arm. When the pivot frame is caused to pivot, the pivot frame pivots about the screw shaft, and this pivoting motion of the pivot frame causes the collet to pivot about the screw shaft together with the conveying arm. By the raising and lowering and pivoting motions of the conveying arm, the pellets which are vacuum-chucked and picked up by the collet are conveyed to a predetermined location.

DETAILED DESCRIPTION OF THE INVENTION

Figure 1:
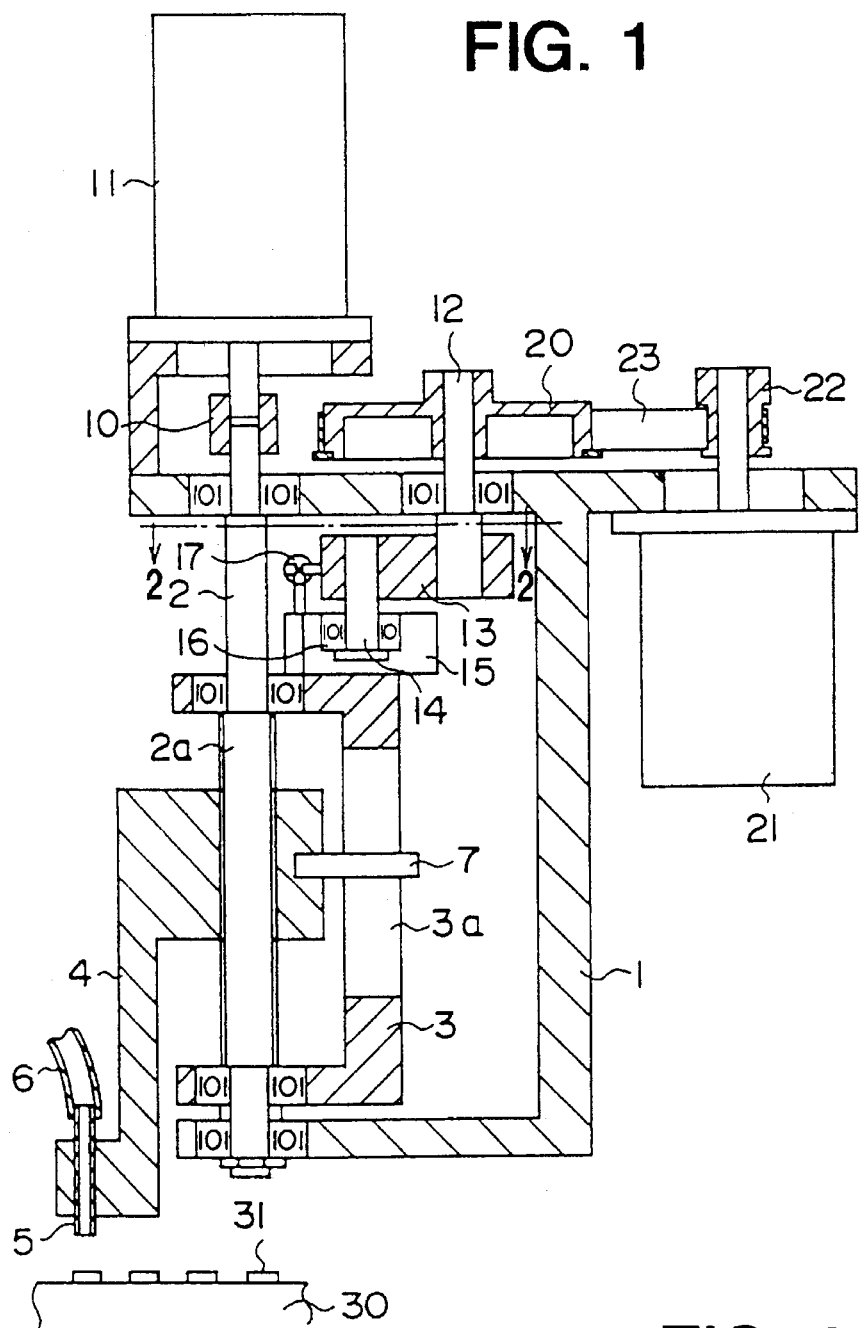
FIG. 1 is a front view of one embodiment of the pellet conveying device of the present invention.
Figure 2:
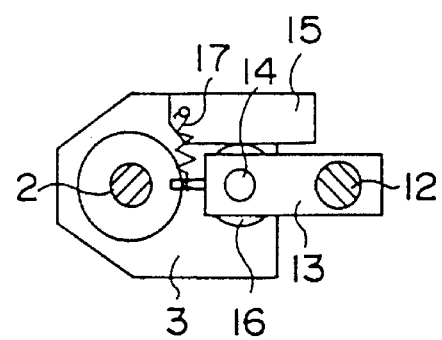
FIG. 2 is a sectional view taken along the line 2—2 in FIG. 1.

In FIG. 1, a screw shaft 2 is supported on a fixed frame 1 in a manner that the screw shaft 2 can rotate. A C-shaped pivot frame 3 is provided on the threaded portion 2a of the screw shaft 2 so that the pivot frame 3 can rotate. A conveying arm 4 is screw-engaged with the threaded portion 2a of the screw shaft 2, and a collet 5 is attached to the conveying arm 4. One end of a pipe 6 which is connected to a vacuum pump (not illustrated) is attached to the collet 5. A rotation-stopping pin 7 which is fastened to the conveying arm 4 is inserted into a longitudinal groove 3a formed in the pivot frame 3. Thus, the conveying arm 4 is connected to the pivot frame 3 via this rotation-stopping pin 7 so that the conveying arm 4 can pivot with the pivot frame 3 and can move up and down (or in the direction of the axis of the screw shaft 2) with the pin 7 of the conveying arm 4 being guided by the groove 3a of the pivot frame 3.

The upper end of the screw shaft 2 is connected to the output shaft of a raising and lowering motor 11 via a coupler 10. The raising and lowering motor 11 is mounted on the fixed frame 1.

A pivot shaft 12 is rotatably supported on the fixed frame 1, and a pivot arm 13 is fastened to the pivot shaft 12. A roller shaft 14 is fastened to the pivot arm 13, and a roller 16 which faces a receiving plate 15 fastened to the upper surface of the pivot frame 3 is supported on the roller shaft 14 so that the roller 16 can pivot. In addition, a spring 17 is mounted between the receiving plate 15 and the pivot arm 13 so that the receiving plate 15 presses against the roller 16.

A timing pulley 20 is fastened to the upper end of the pivot shaft 12. A pivoting driving motor 21 is mounted to the fixed frame 1, and a timing belt 23 is provided between the timing pulley 21 and a timing pulley 22 which is fastened to the output shaft of the pivoting driving motor 21.

The angular range of pivoting motion of the conveying arm 4 is set to be 30 to 120 degrees. The pivoting motion and pivoting angle are derived from the amount of rotation of the pivoting driving motor 21 and provided to the conveying arm 4 via a linkage comprised of the timing pulley 22, timing belt timing pulley 20, pivot arm 13 and receiving plate 15.

In operation, when the raising and lowering motor 11 rotates with the collet 5 positioned above the pellet pick-up position, the screw shaft 2 rotates. As a result, the conveying arm 4 that is screw-engaged with the shaft 2 is lowered, and the collet 5 comes into contact with the pellet 31 that is placed on the pellet stage 30. Then, the vacuum pump (not illustrated) is actuated, and the collet 5 holds the pellet by vacuum suction.

Next, the raising and lowering motor 11 is rotated in the reverse direction, so that the collet 5 is raised by a fixed amount together with the conveying arm 4.

Then, the pivoting driving motor 21 is rotated by a prescribed amount, thus causing the pivot shaft 12 to rotate by a prescribed amount via the timing pulley 22, timing belt 23 and timing pulley 20.

When the pivot shaft 12 is rotated by a predetermined angle (30–120 degrees), the pivot arm 13 pivots and pushes the receiving plate 15; as a result, the pivot frame 3 pivots about the screw shaft 2. Since the rotation-stopping pin 7 that is fastened to the conveying arm 4 is inserted into the longitudinal groove 3*a* of the pivot frame 3 so that the conveying arm 4 is connected to the pivot frame 3, the conveying arm 4 is pivoted by a prescribed amount (in other words, the arm 4 pivots) about the screw shaft 2 by the pivot motion of the pivot frame 3.

With this pivot motion, the conveying arm 4 is positioned above a bonding point such as above a lead frame, etc. or above a pellet carrier such as a pellet jig loading section and pellet positioning section.

In this case, since the conveying arm 4 pivots about the threaded portion 2*a* of the screw shaft 2, the conveying arm 4 is slightly raised or lowered (this raising or lowering determined by the direction of the threads of the threaded portion 2*a*) in proportion to the rotational angle of the conveying arm 4.

Next, the raising and lowering motor 11 is rotated so that the conveying arm 4 is lowered, and the collet 5 holding the pellet 31 by suction-chucking bonds the pellet 31 to the bonding position where a lead frame, etc. (not illustrated) is positioned, after which the vacuum used to chuck the pellet 31 is cut off.

Alternatively, in cases where the pellet 31 is to be transferred to the pellet carrier such as the pellet jig loading position and pellet positioning section, the collet 5 is positioned slightly above the pellet carrier, the vacuum is cut off, and the pellet 31 is placed on the pellet carrier.

After these pellet releasing motions, the raising and lowering motor 11 is rotated in the reverse direction so that the conveying arm 4 is raised by a prescribed amount; then, the pivoting driving motor 21 is rotated in the reverse direction so that the conveying arm 4 pivots in the opposite direction from the direction described above, thus causing the collet 5 to be moved above the original pellet pick-up position (pellet stage).

One cycle of the conveying operation is thus completed.

As seen from the above, the moving components used in the device of the present invention are the screw shaft 2, pivot frame 3, conveying arm 4, collet 5, pivot shaft 12 and pivot arm 13. Accordingly, the device can be compact in size and light in weight, and the raising and lowering motor 11 and pivoting driving motor 21 can be rotated at a high speed (i.e., the pellets are conveyed at a high speed), thus improving the productivity of the process.

As described in detail above, the pellet conveying device of the present is comprised of: a screw shaft which has a threaded portion, a pivot frame which is rotatably supported on the screw shaft, a conveying arm which is screw-engaged with the threaded portion of the screw shaft and engaged with the pivot frame so that the conveying arm can pivot along with the pivot frame and can move up and down with respect to the pivot frame, a collet which is attached to the conveying arm, a screw shaft driving means which rotates the screw shaft, and a pivoting driving means which causes the pivot frame to pivot. Accordingly, the weight of the moving components of the device is small, allowing a high-speed conveying operation and improving the productivity.

We claim:

1. A pellet conveying device comprising:

a screw shaft having a threaded portion;

a first motor for rotating said screw shaft;

a pivot frame rotatably provided on said screw shaft;

a longitudinal groove provided in said pivot frame;

a conveying arm screw-engaged with said threaded portion of said screw shaft and connected to said pivot frame via a rotation-stopping pin guided by said longitudinal groove so that said conveying arm is pivoted within a predetermined angular range by said pivot frame, said conveying arm being moved in a direction of an axis of said screw shaft when said screw shaft is rotated by said first motor;

a second motor for causing a pivot motion of said pivot frame;

a link means linking said second motor to said pivot frame so that said pivot frame is pivoted within said predetermined angular range; and a collet provided on said conveying arm.

2. A pellet conveying device according to claim 1, wherein said predetermined angular range is between 30 and 120 degrees.

* * * * *